(12) United States Patent
Hoskins et al.

(10) Patent No.: US 10,128,838 B2
(45) Date of Patent: Nov. 13, 2018

(54) REFLECTIVE SWITCH INPUT SURFACE (71) Applicant: Kostal of America, Troy, MI (US)

(72) Inventors: Steven R. Hoskins, Walled Lake, MI (US); Michael F. Tefend, Lake Orion, MI (US)

(73) Assignee: Kostal of America, Troy, MI (US)

( * ) Notice: Subject to any disclaimer, the term of this patent is extended or adjusted under 35 U.S.C. 154(b) by 307 days.

(21) Appl. No.: 14/981,059

(22) Filed: Dec. 28, 2015

(65) Prior Publication Data

US 2016/0191055 A1 Jun. 30, 2016

Related U.S. Application Data (60) Provisional application No. 62/098,647, filed on Dec. 31, 2014.

(51) Int. Cl.
*H03K 17/96* (2006.01)
*G01S 17/02* (2006.01)
*G01S 17/87* (2006.01)
*G01S 7/481* (2006.01)

(52) U.S. Cl.
CPC ........ *H03K 17/9629* (2013.01); *G01S 17/026* (2013.01); *G01S 17/87* (2013.01); *H03K 17/9631* (2013.01); *H03K 17/9638* (2013.01); *G01S 7/4813* (2013.01); *H03K 2217/96015* (2013.01)

(58) Field of Classification Search
CPC ........... H03K 17/9629; H03K 17/9631; H03K 17/9638; H03K 2217/96015; G01S 17/87; G01S 17/026; G01S 7/4813; G06F 3/042; G06F 3/0421; G06F 3/0422; G06F 3/0423; G06F 3/0424; G06F 3/0425; G06F 3/0426; G06F 3/0427; G06F 3/0428
USPC ...................................... 250/341.7
See application file for complete search history.

(56) References Cited

U.S. PATENT DOCUMENTS

| 8,553,014 | B2 | 10/2013 | Holmgren et al. | |
|---|---|---|---|---|
| 8,643,628 | B1 | 2/2014 | Eriksson et al. | |
| 2009/0273563 | A1* | 11/2009 | Pryor | B60K 35/00 345/157 |
| 2012/0311592 | A1* | 12/2012 | Kim | G06F 9/4887 718/102 |
| 2013/0187891 | A1* | 7/2013 | Eriksson | G06F 3/0421 345/175 |

(Continued)

*Primary Examiner* — Marcus Taningco
*Assistant Examiner* — Gisselle Gutierrez
(74) *Attorney, Agent, or Firm* — Butzel Long; Gunther J. Evanina (57) ABSTRACT Example embodiments of a reflective switch and methods for preventing inadvertent actuation of the reflective switch are disclosed. Exemplary embodiments of the reflective switch comprise a plurality of photo emitters that emit light through a translucent zone and a plurality of photo detectors that detect light rays that are reflected back through the translucent zone by an operator input. Upon detecting reflected light rays, the photo detectors send reflective signals to a controller. The controller then monitors whether the unique addresses of the photo detectors are increasing or decreasing and whether the addresses have increased or decreased to a predetermined threshold to merit a change in switch state. An indicia may be configured to notify an operator that a new switch state has been achieved.

20 Claims, 12 Drawing Sheets (56) References Cited

U.S. PATENT DOCUMENTS

| | | | | |
|---|---|---|---|---|
| 2014/0364218 A1* | 12/2014 | Holmgren | G01S 17/48 | 463/31 |
| 2015/0103051 A1* | 4/2015 | Wyrwas | G06F 3/0416 | 345/175 |
| 2015/0138101 A1* | 5/2015 | Park | G06F 3/0412 | 345/173 |
| 2016/0098095 A1* | 4/2016 | Gonzalez-Banos | G06F 3/017 | 345/156 |
| 2016/0179261 A1* | 6/2016 | Drumm | G06F 3/042 | 345/175 |
| 2016/0191055 A1* | 6/2016 | Hoskins | G01S 17/026 | 250/341.7 |
| 2016/0306437 A1* | 10/2016 | Zhang | G06F 3/0202 | |
| 2017/0235431 A1* | 8/2017 | Kwon | G06F 3/0425 | 345/175 |
| 2017/0255337 A1* | 9/2017 | Drumm | G06F 3/0421 | |
| 2017/0317655 A1* | 11/2017 | Snyder | H03G 3/04 | |

\* cited by examiner

REFLECTIVE SWITCH INPUT SURFACE

CROSS-REFERENCE TO RELATED APPLICATIONS

This application claims priority to U.S. provisional patent application No. 62/098,647 filed on Dec. 31, 2014, which is hereby incorporated by reference in its entirety.

BACKGROUND

Conventional touch sensing devices have typically been capacitive and resistance based. These types of touch sensing devices may be desirable because many stylists have proclivities toward designs with continuity, or continuous surfaces in general. For example, automotive stylists appear to be moving toward sleek, continuous instrument panels and center consoles. Stylists and consumers may prefer a smooth, continuous touch screen to control the functions of their automobiles, instead of mechanical dials and push buttons. Capacitive and resistance based touch sensing devices make this style choice a reality. Capacitive and resistance based touch sensing devices may also be beneficial because their switch packages are generally smaller and lighter than mechanical-type switch packages.

Despite the advantages of capacitive and resistance based touch sensing devices, there remains drawbacks. For example, capacitive touch sensing devices may not work well when condensation is present on the touch sensing surface, and may be inoperable when an operator is wearing gloves. Capacitive based touch sensing devices generally rely on an electrically conducting stylus; thus, capacitive based touch sensing devices may fail to perform as intended in these circumstances. Further, a stylist is limited to materials that can be used for capacitive and resistance based touch sensing devices.

Optical touch sensing devices address at least some of the challenges of capacitive and resistance based touch sensing devices. However, optical based touch sensing devices may face different issues. For example, an operator may inadvertently actuate an optical touch sensing device, which in some circumstances may place the operator in danger.

Thus, there is a need for an optical sensing device that avoids inadvertent actuation.

BRIEF DESCRIPTION OF THE DRAWINGS

FIG. 13 9 is a top plan view of a reflective switch having a linear configuration, wherein the photo detectors have unique addresses from one to eight.

DETAILED DESCRIPTION

Multiple embodiments of a reflective switch 2 are described with reference to the drawings, wherein like numerals reference like structures. Although reflective switch 2 may be illustrated and described herein as including particular components in a particular configuration, the components and configuration shown and described are provided for example purposes only. The figures and descriptions of the embodiments described herein are not intended to limit the breadth or the scope of the inventive concepts or the appended claims in any manner. Rather, the figures and detailed descriptions of reflective switch 2 are provided to illustrate the inventive concepts to a person of ordinary skill in the art and to enable such person to make and use the inventive concepts.

Figure 1:
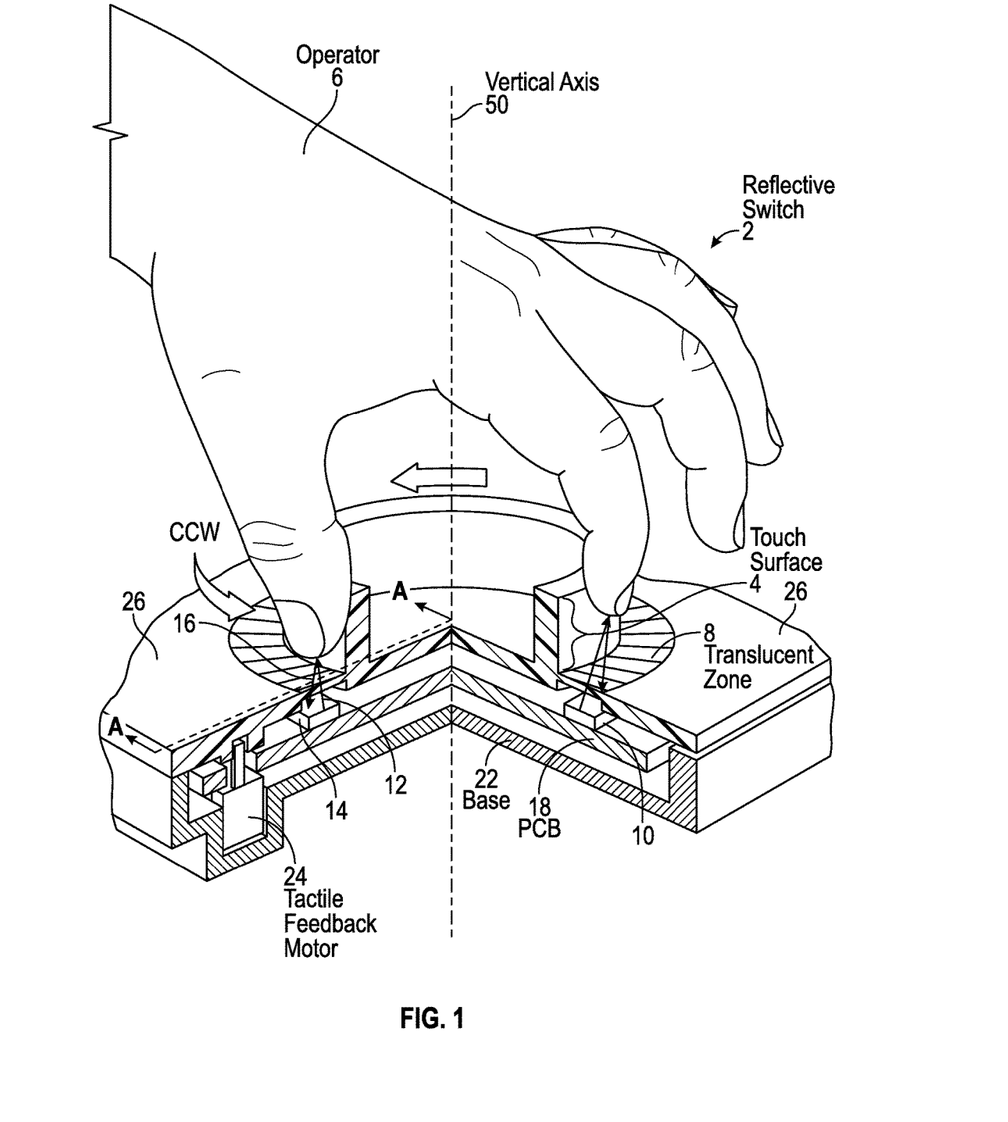
FIG. 1 is a perspective view of one embodiment of a reflective switch with a section removed for clarity.

Turning now to the drawings, FIG. 1 is a perspective view of an exemplary reflective switch 2 having an annular configuration. Although reflective switch 2 is shown in an annular configuration, other geometric configurations are also possible, including but not limited to linear configurations, L-shaped configurations, or complex configurations, such as a shift pattern for a gear selector lever in an automatic transmission vehicle. The annular configuration of reflective switch 2 shown in FIG. 1 is merely an example of many possible configurations.

In this embodiment, reflective switch 2 comprises an annularly disposed touch surface 4 that extends from paneling 26 axially along vertical axis 50. Touch surface 4 allows an operator 6 to quickly locate his fingers in the correct position such that the operator 6 may slide his fingers along its surface to change the switch state of reflective switch 2. It should be noted that operator 6 may be either a male or female, or any capable being. Touch surface 4 may comprise of any desired material, including but not limited to metals, plastics, wood, or leather.

Touch surface 4 is stationary; it functions merely as a guide. In this example, touch surface 4 may be used to guide the fingers of operator 6 in either a clockwise (CW) or counter clockwise (CCW) direction, depending on the desired switch state. A translucent zone 8 is shown disposed annularly about the base of touch surface 4. Translucent zone 8 is generally axially level with paneling 26 such that the translucent zone 8 and paneling 26 form a continuous surface, which may be an important consideration for stylists.

Reflective switch 2 is an optical sensing device. Reflective switch 2 comprises a plurality of photo emitters 10 and photo detectors 14 arranged below the surface of the translucent zone 8. In FIG. 1, photo emitters 10 and photo detectors 14 are shown arranged annularly beneath translucent zone 8.

Figure 2:
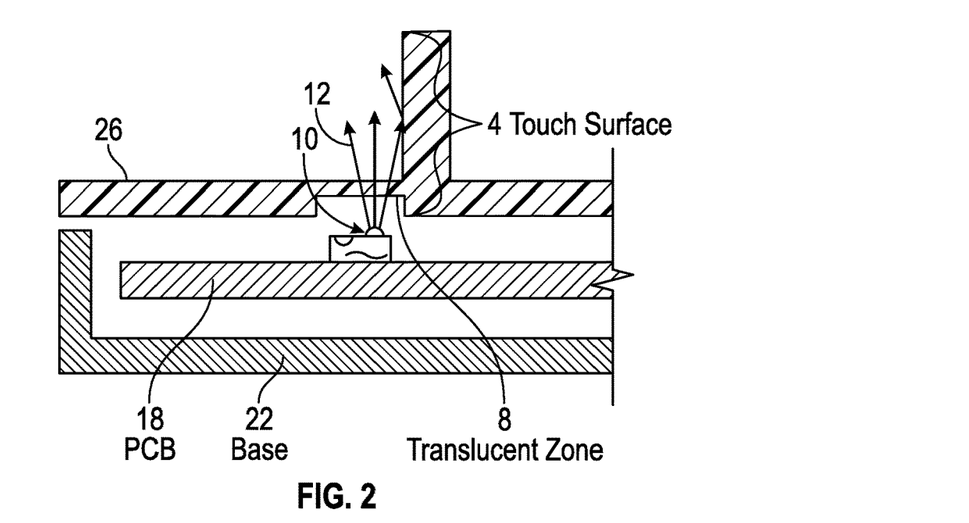
FIG. 2, taken on line A-A of FIG. 1, is a cross-sectional view of the reflective switch.

Referring now to FIG. 2, a cross-sectional view of reflective switch 2, taken on line A-A of FIG. 1, is shown. Photo emitter 10 emits emitted light rays 12 through translucent zone 8. Photo emitters 10 may be light emitting diodes capable of emitting infrared light. The photo emitter 10 shown in FIG. 2 may emit emitted light rays 12 constantly, or alternatively, photo emitter 10 may emit emitted light rays 12 when triggered by a trigger input, such as by a motion sensor (not shown) sensing motion of an operator 6 drawing her hand near reflective switch 2. The triggering of the photo emitters 10 by a given trigger input could be advantageous if reflective switch 2 is used infrequently; thus, energy could be saved and the photo emitters 10 could potentially have a longer useful life. Other like methods for triggering photo emitters 10 to emit emitted light rays 12 are possible.

Emitted light rays 12 are emitted generally along the same orientation or contour as touch surface 4. In this example, touch surface 4 extends axially vertical from paneling 26, wherein substantially all of the length of extending touch surface 4 is perpendicular to the surface of paneling 26. In FIG. 2, the emitted light rays 12 are shown emitted generally along the contour of touch surface 4. One of ordinary skill in the art will appreciate that photo emitters 10 should be oriented to emit emitted light rays 12 generally along a given touch surface 4, no matter its shape or contour.

Figure 3:
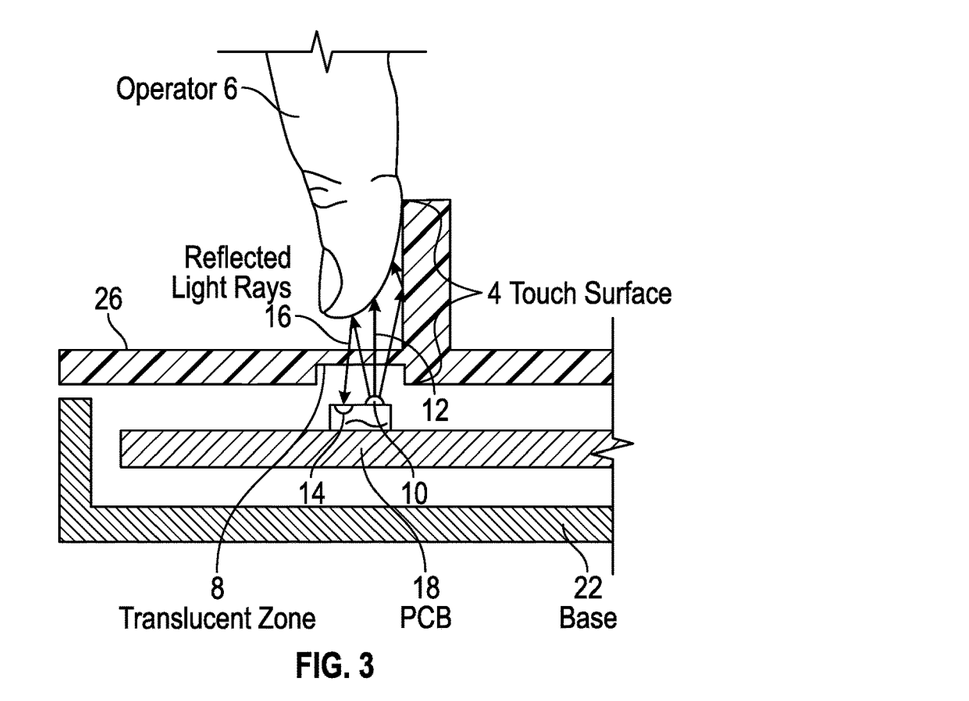
FIG. 3, taken on line A-A of FIG. 1, is a cross-sectional view illustrating an operator reflecting light emitted from a photo emitter back toward a photo detector.

FIG. 3 illustrates an operator 6 providing a reflective input to reflective switch 2. The photo emitter 10 emits emitted light rays 12 through the translucent zone 8. When an operator's finger or alternative stylus is present, emitted light rays 12 are reflected back through the translucent zone 8 and are detected by photo detectors 14. Upon detecting reflected light rays 16, the detecting photo detector 14 sends a reflective signal to controller 20. Photo detectors 14 may be configured with a photocell, input optics, and circuitry to convert the detected reflected light rays 16 (input) into a reflective signal (output). Photo detectors 14 may send reflective signals in any number of ways to controller 20, such as by analog or digital signals, or messages. Photo detectors 14 may be photodiodes capable of detecting infrared light. The controller 20 and photo detectors 14 may be electrically connected via a printed circuit board (PCB) 18 or by other circuitry, or by wireless methods, such as any number of wireless personal area network (WPAN) methods. In FIG. 3, a PCB 18 is used.

Controller 20 may be equipped with electronics (hardware and software) to be in communication with a vehicle bus (not shown), or other internal communications equipment. Controller 20 may optionally include computer readable storage media for storing data representing instructions executable by a computer or microprocessor. Computer readable storage media may include one or more of random access memory as well as various non-volatile memory such as read-only memory or keep-alive memory. As would be appreciated by one of ordinary skill in the art, computer readable storage media may include various types of physical devices for temporary and/or persistent storage of data. Exemplary physical devices include but are not limited to DRAM, PROMS, EPROMS, EEPROMS, and flash memory.

Figure 4:
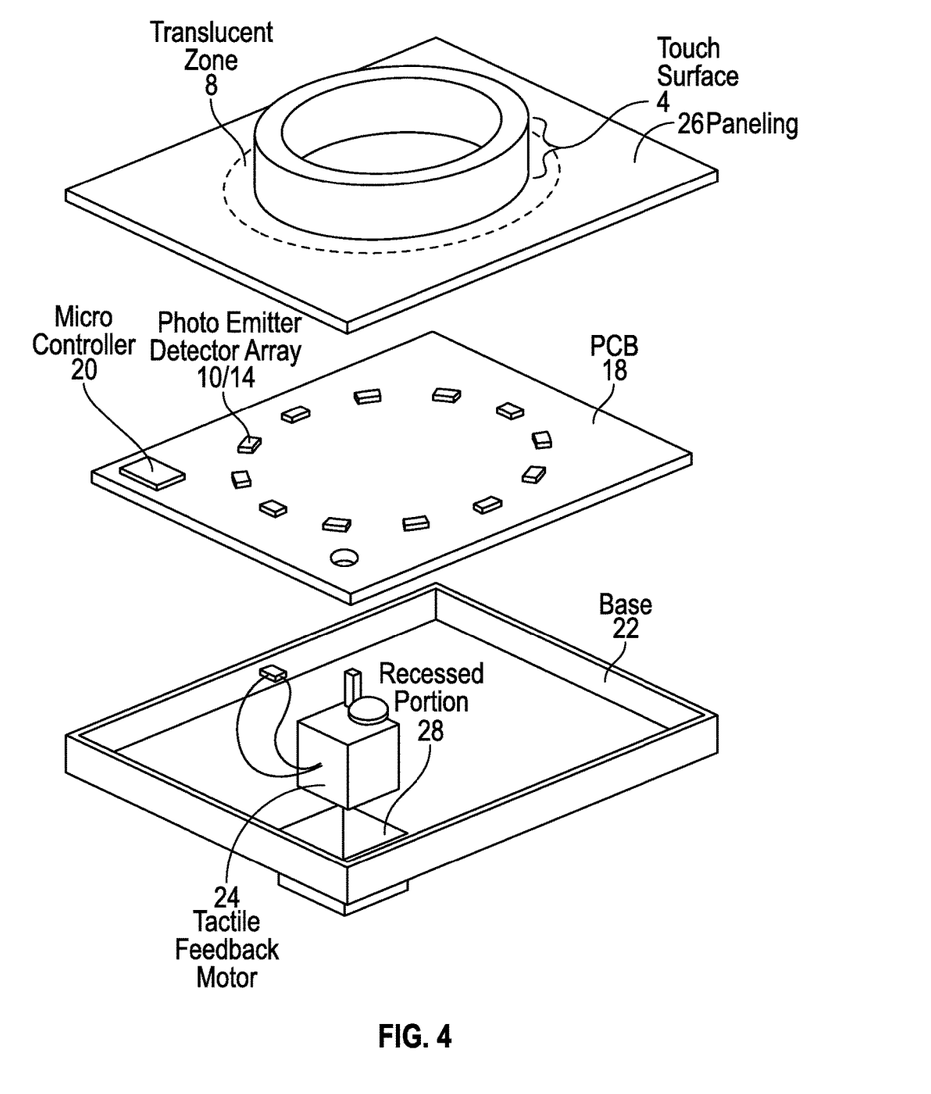
FIG. 4 is an exploded view of an exemplary reflective switch assembly.

Referring now to FIG. 4, an exploded assembly view of reflective switch 2 having an annular configuration is shown. Starting from the top of the drawing, annular touch surface 4 is shown fixed atop paneling 26. Translucent zone 8 is shown forming a seemingly continuous surface with paneling 26, and is disposed annularly around the base of annular touch surface 4.

Between the base 22 and paneling 26 is PCB 18. PCB 18 comprises a plurality of Photo emitters 10 and Photo detectors 14. In this example, photo emitters 10 and photo detectors 14 are arranged annularly to follow the path of translucent zone 8. As shown in FIG. 4, photo emitters 10 and photo detectors 14 may be included in the same chip.

Base 22 supports the structure of reflective switch 2. Base 22 may include a recessed portion 28 to house a tactical feedback motor 24. PCB 18 and paneling 26 may be fit into the base 22 to complete the assembly of reflective switch 2.

Exemplary Embodiment #1

Figure 8:
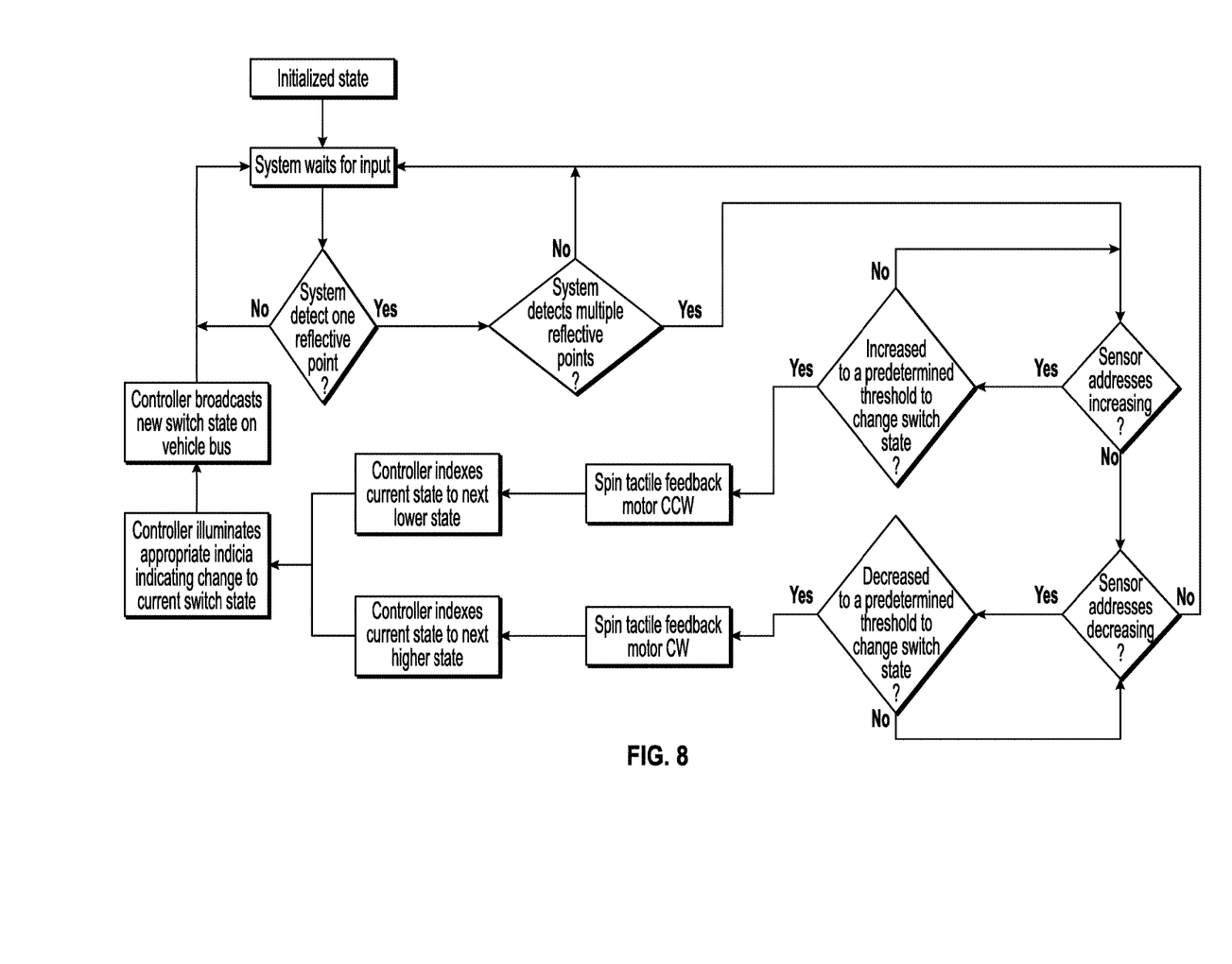
FIG. 8 is a flow chart illustrating how one exemplary embodiment of a reflective switch avoids inadvertent actuation.

In a first exemplary embodiment, a reflective switch 2 configured to avoid inadvertent actuation of the switch is described. FIG. 8 is a flow chart illustrating how the first exemplary embodiment of reflective switch 2 operates to avoid inadvertent actuation.

First, the system is initialized. The system may be initialized by any number of methods. For example, controller 20 can control photo emitters 10 to emit light constantly, or alternatively, controller 20 may signal to the photo emitters 10 to emit light when a trigger input is received. For instance, if a motion sensor (not shown) senses motion, the motion sensor may send a signal to the controller 20 that motion has been detected, and as a result, controller 20 signals to the photo emitters 10 to emit light. At such point, the system is initialized. Meaning, the photo emitters 10 are emitting light.

After the system has been initialized, reflective switch 2 waits for an input. In this embodiment, at least two reflective signals must be detected by the reflective switch 2 for its switch state to be changed; the switch state of the reflective switch 2 will not change if only one reflective signal is detected. A change in switch state could be a reflective switch going from an "on" state to an "off" state, a "lights on" state to a "lights off" state, etc. After at least two inputs are detected, the system monitors for increasing or decreasing addresses, which will hereinafter be described in more detail.

Figure 9:
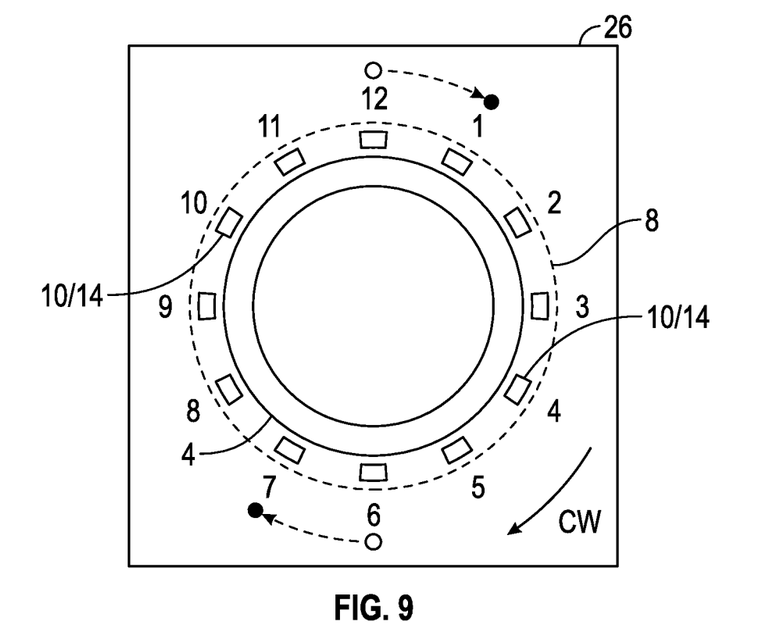
FIG. 9 is a top plan view of a reflective switch having an annular configuration, wherein the photo detectors have unique addresses from one to twelve.

Each photo detector 14 in the plurality of photo detectors possesses a unique address. For example, a switch having an array of photo detectors in an annular array may be labeled in the same manner as hours on the face of a clock. Meaning the addresses span from one to twelve, with addresses increasing in a CW direction. FIG. 9 shows a plurality of photo detectors having unique addresses as described above.

As mentioned above, after two reflective signals are detected, the controller 20 monitors whether the unique addresses of the photo detectors 14 are increasing or decreasing. In other words, the system monitors whether the operator 6 is sliding her fingers along the touch surface 4. In the context of this example, increasing addresses means that the operator 6 is moving his hand or fingers in a CW direction. Decreasing addresses means that the operator 6 is moving his hand or fingers in a CCW direction. In other configurations, such as a linear touch surface 4 configuration, increasing addresses could mean that the operator 6 is moving his hand away from his body, and that decreasing addresses could mean that the operator 6 is moving his hand or fingers toward his body. In a linear left to right touch surface 4 configuration, increasing addresses could mean that an operator 6 is moving his finger along the touch surface 4 in a left to right direction, whereas decreasing addresses could mean that an operator 6 is moving his finger or fingers in a right to left direction.

With reference to FIG. 9, a description of how the system monitors the unique addresses of each photo detector 14 is explained in greater detail. If an operator 6 places his fingers at photo detectors 14 having unique addresses of twelve and six, photo detectors 14 will send reflective signals to controller 20 indicating that reflective inputs have been detected at the two addresses. The initial addresses where an operator 6 places her fingers are called the initial reflective points. Two open circles are shown at addresses twelve and six, which are the addresses or locations of the initial reflective points. If two reflective inputs have been detected, controller 20 will then monitor if the unique addresses of the other photo detectors 14 are detecting reflective inputs (i.e., whether the addresses are increasing or decreasing). With regard to the operator's input at reflective point twelve, the controller 20 will monitor the photo detectors 14 immediately adjacent to reflective point twelve, which would be reflective points eleven and one, to check if the photo detectors 14 at these addresses are detecting reflective inputs. With regard to the operator's 6 input at reflective point six, the controller 20 will monitor the photo detectors 14 immediately adjacent to reflective point six, which would be reflective points seven and five, to check if the photo detectors 14 at these addresses are detecting reflective inputs.

Continuing with the example above where the operator 6 has placed her fingers at initial reflective points twelve and six, if the operator 6 moves her fingers CW, her fingers will initially move to photo detectors 14 having unique addresses of one and seven, or reflective points one and seven. The movement of the operator's fingers from initial reflective points twelve-six to reflective points one-seven is shown by the dashed lines in FIG. 9. Reflective points one-seven are shown by the colored circles in FIG. 9. When the photo detectors 14 having unique addresses of one and seven detect reflected light rays 16, reflective signals are sent from these reflective points to controller 20. The controller 20 then recognizes that the unique addresses of the photo detectors 14 are increasing. Next, controller 20 processes whether the increasing addresses have increased to a predetermined threshold so as to cause reflective switch 2 to change switch states.

The predetermined threshold may be set appropriately in light of certain factors, including but not limited to the number of switch states reflective switch 2 is designed to control, human factors and ergonomics (e.g., taking into account the strain on an operator's wrist when the operator slides his fingers about a touch surface having an annular configuration), and the number of photo emitters/detectors 10, 14 in the system. Continuing with the example above, if a reflective switch is designed with two switch states, "on" and "off", the predetermined threshold might be an increase (or decrease) of three addresses. Thus, if an operator 6 placed his fingers at initial reflective points twelve-six, operator 6 would be required to slide his fingers to reflective points three-nine in order to change the switch state of reflective switch 2. This increasing of addresses could change the reflective switch 2 from "off" to "on". If the operator wished to change the switch state from "on" to "off", operator 6 could place her fingers at initial reflective points five-seven, for example. To change switch states, she would be required to move her fingers from initial reflective points five-seven to reflective points two-four. This would effectively decrease the unique addresses to the exemplary predetermined threshold (three addresses). One of skill in the art will recognize that the predetermined threshold for changing the switch state of reflective switch 2 may vary depending on the factors listed above, as well as other foreseeable factors.

Depending on whether the unique addresses of the photo detectors 14 are either increasing or decreasing to a predetermined threshold, the controller 20 may be configured to spin unbalanced tactile feedback motor 24 to alert operator 6 that a change in switch state has occurred. The feedback provided by the tactile feedback motor 24 could be in the form of a sound alert or could be through other indicia as described more fully below. Alternatively, controller 20 may itself send the appropriate signals to various indicia without need for a tactical feedback motor 24.

Figure 5:
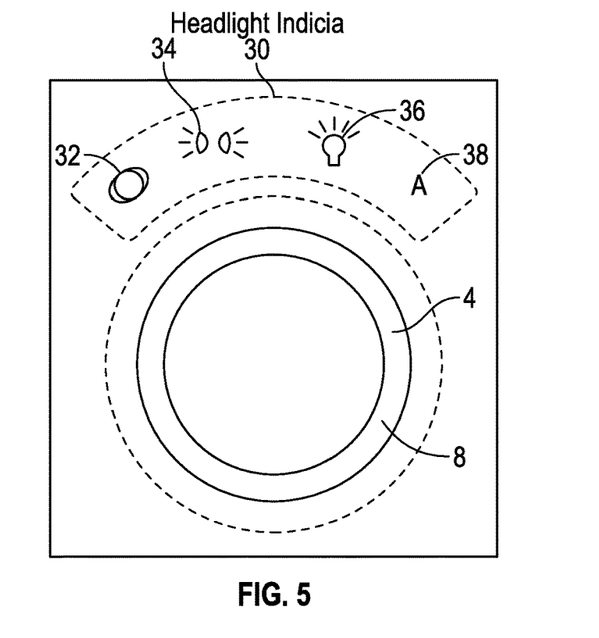
FIG. 5 is a view of an example indicia panel.

After a switch state has been changed, controller 20 may illuminate appropriate indicia indicating to operator 6 that a new switch state has been achieved. For example, FIG. 5 illustrates a top view of an exemplary reflective switch 2 that operates to change the switch state of headlight indicia 30. Here, there are four different switch states shown. From left to right, an "off" state 32, a "parking light" state 34, a "high beam" state 36, and an "automatic" state 38 are shown. An operator 6 may slide her fingers about the touch surface 4 to change the switch state of headlight indicia 30. After a new switch state is selected, controller 20 broadcasts the new switch state to the module that the reflective switch 2 is controlling. For example, if reflective switch 2 was designed to control the headlights of an automobile, controller 20 would broadcast the new switch state to the vehicle bus, which would in turn send the signal to the electronic control unit, which would then turn the headlights to the desired switch state.

Figure 6:
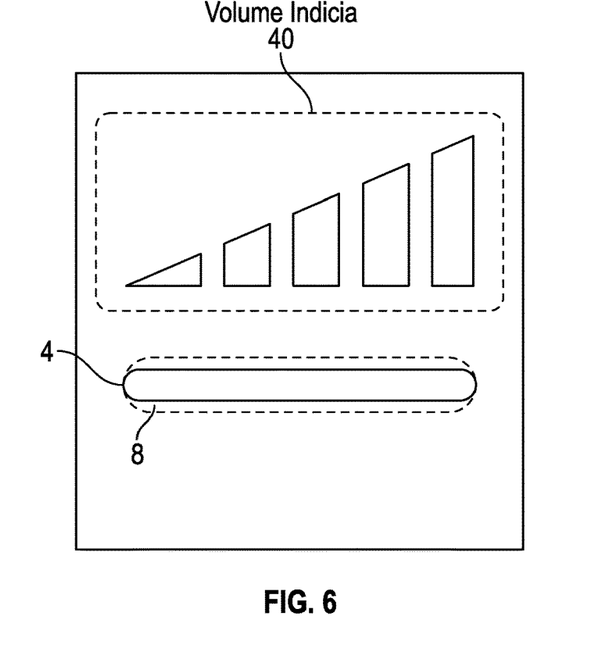
FIG. 6 is a view of another example indicia panel.
Figure 7:
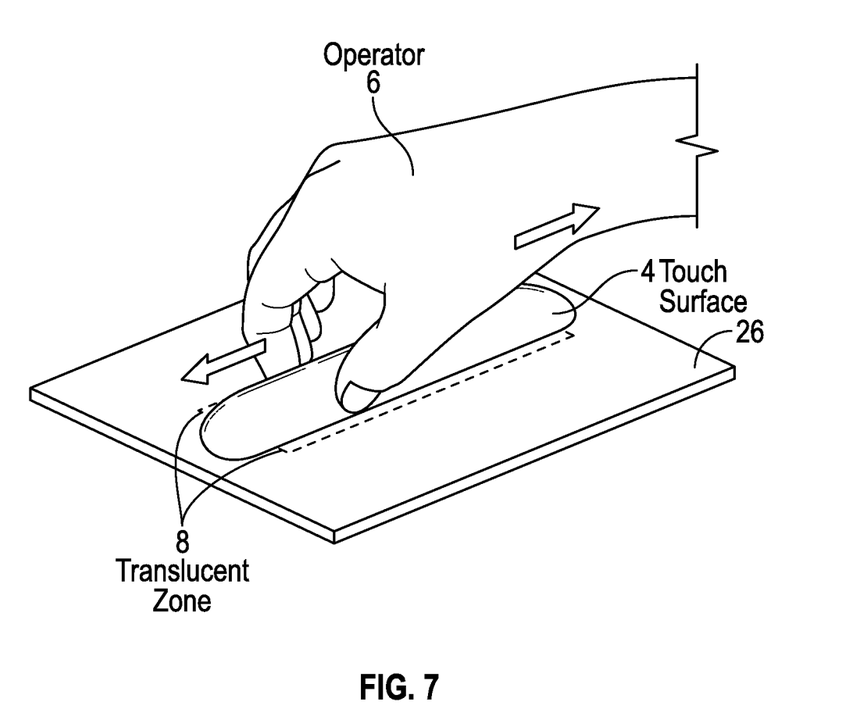
FIG. 7 is a perspective view of a second embodiment of an exemplary reflective switch having a linear touch surface.

FIG. 6 is a view of another example indicia panel. In this example, a touch surface 4 having a linear configuration is shown, much like the reflective switch 2 in FIG. 7. In this configuration, there are translucent zones 8 on both sides of touch surface 4. In this example, to avoid inadvertent actuation, the system still requires at least two inputs before a switch state may be changed. A reflective switch 2 having a linear configuration may be configured to require an input on both sides of the touch surface 4 before proceeding with the steps found in the flow chart of FIG. 8. The operator 6 translates his hand either forward or backward (or left to right) along touch surface 4 to change the switch state, which occurs using the same method as described above. In the case of the volume indicia 40, the translation of the operator's fingers along the touch surface 4 will increase or decrease the volume.

Exemplary Embodiment #2

Figure 10:
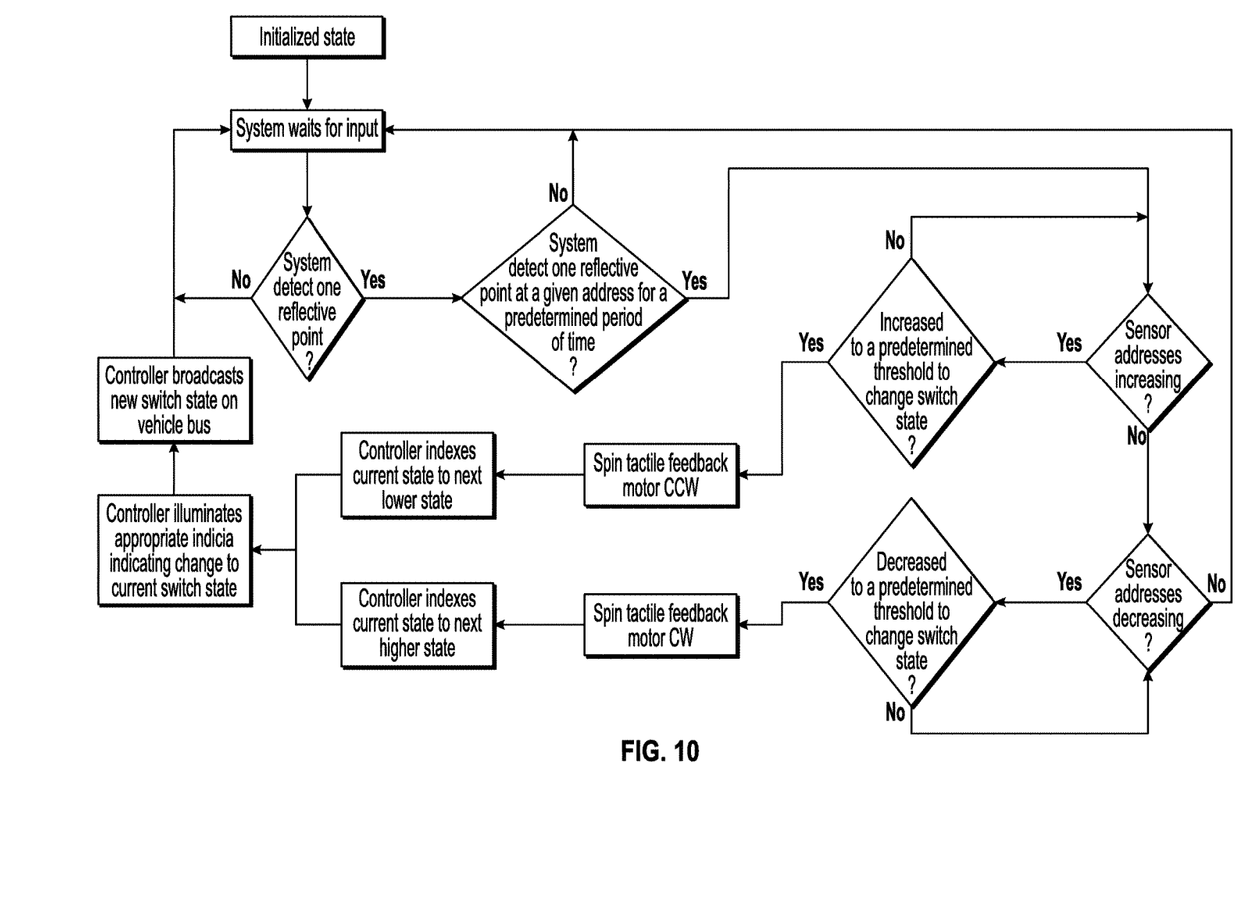
FIG. 10 is a flow chart illustrating how a second embodiment of an exemplary reflective switch operates to prevent inadvertent actuation.

A second exemplary embodiment of a reflective switch 2 that avoids inadvertent actuation is disclosed in the flow chart of FIG. 10. In the second embodiment, the system initializes in the same manner as in the first embodiment. Next, the system waits for an input from the operator 6. Only one input is required by the system in this embodiment. When the input is received at a given initial reflective point, the photo detector 14 that detected the input sends a reflective signal to the controller 20. Once an input is detected, the controller 20 checks to see if the reflective input is held at the initial reflective point (or address of the photo detector that initially detects a reflective input) for a predetermined period of time.

Figure 11:
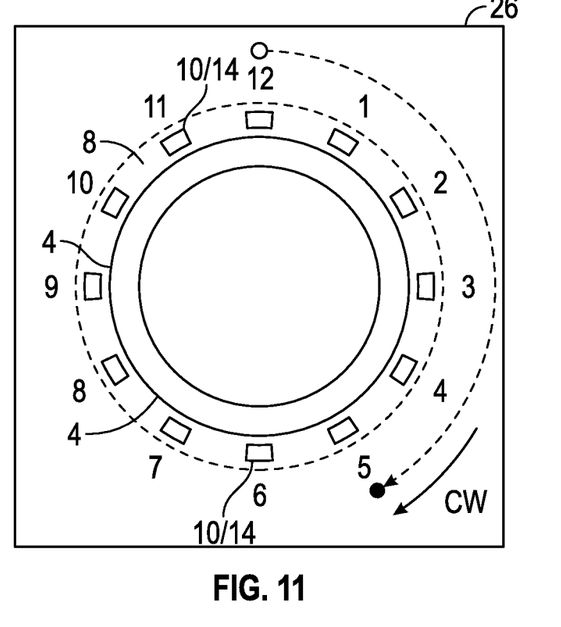
FIG. 11 is a top plan view of a reflective switch having an annular configuration, wherein the photo detectors have unique addresses from one to twelve, and an operator has moved his finger from initial reflective point twelve to end reflective point five.

For example, with reference to FIG. 11, an operator 6 may place his finger at photo detector 14 having a unique address of twelve. For the reflective switch 2 to change states, the operator 6 must hold his finger at initial reflective point twelve for a predetermined period of time. The predetermined period of time could be any amount of time. It could be one half second or it could be one second, for example. One of ordinary skill in the art will recognize that setting the predetermined period of time that an operator 6 must hold his or her finger at the initial reflective point may depend on what the reflective switch 2 is designed to control. For instance, the predetermined period of time to change a radio station may be less than the desired predetermined period of time to shift gears in an automatic transmission automobile. One of skill will appreciate that the more serious the change in switch state, the more important it may be to prevent inadvertent actuation.

If an operator 6 does not hold his finger at the initial reflective point for a predetermined period of time and slides his finger around the touch surface, the reflective switch 2 will not change switch states in this example. Rather, the system will loop back to await another reflective input. If an input is detected by the system and operator 6 holds his finger (or other stylus) at the initial reflective point for a predetermined period of time, the controller 20 will then monitor whether the unique address are either increasing or decreasing, and if so, whether the unique addresses have increased or decreased to a predetermined threshold to change the switch state of reflective switch 2. Continuing with the example with reference to FIG. 11, if the operator 6 moves his finger from initial reflective point twelve (open circle) to reflective point five (darkened circle), the switch state of reflective switch 2 may be changed if the address increase from twelve to five (a movement in the CW direction means the addresses are increasing) is a sufficient address increase to meet the predetermined threshold to change the switch state of reflective switch 2.

If the switch state is changed, the tactile feedback motor 24 may spin in a given direction, either CW or CCW depending on whether the unique addresses are increasing or decreasing. The controller 20 then indexes the new switch state, sends a signal to the indicia to illuminate, and then broadcasts the new switch state to the module the reflective switch 2 is configured to control, which might be the volume control in an automobile or interior lights in the cabin of a yacht, for example; reflective switch 2 may be used in numerous applications. Alternatively, a system may include a controller 20 that may sense a change in switch state and send an appropriate signal to an indicia without need for a tactile feedback motor 24.

Exemplary Embodiment #3

Figure 12:
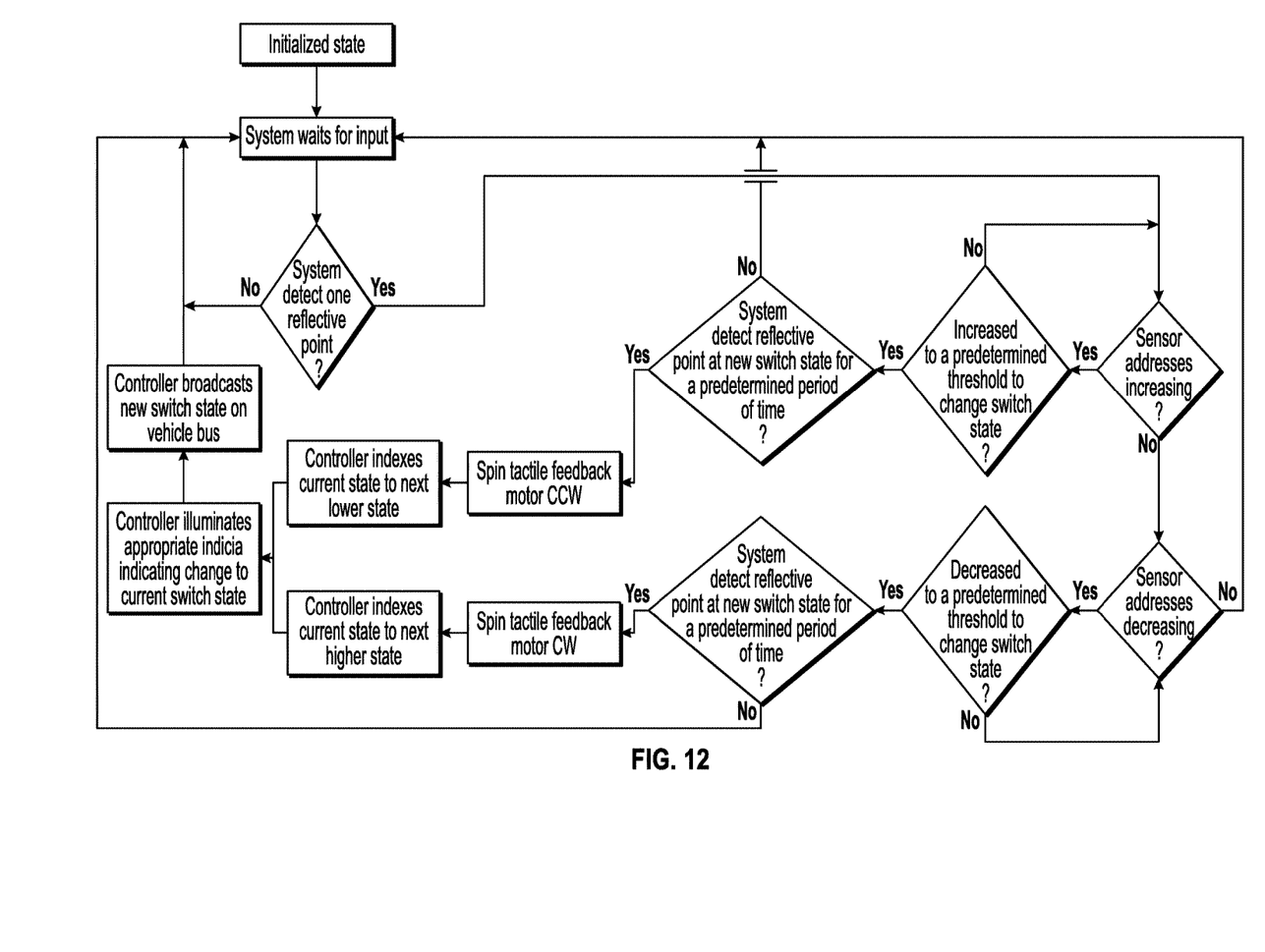
FIG. 12 is a flow chart illustrating how a third embodiment of an exemplary reflective switch operates to prevent inadvertent actuation.

A third exemplary embodiment of a reflective switch 2 that avoids inadvertent actuation is disclosed in the flow chart of FIG. 12. In the third embodiment, the system initializes in the same manner as in the first and second embodiments. Next, the system waits for an input from operator 6. Only one input is required by the system in this embodiment. When the input is received at a given unique address (or initial reflective point), the photo detector 14 that detected the input generates and sends a reflective signal to the controller 20. Once an input is detected, controller 20 checks to see if the unique addresses of the system are increasing or decreasing.

If the unique address are either increasing or decreasing, the controller 20 monitors whether the unique addresses have increased or decreased to a predetermined threshold to change the switch state of reflective switch 2. If the answer is "yes," controller 20 then checks to see if the system has detected a reflective input at an end reflective point for a predetermined period of time. An "end reflective point" is the final location (or address) where an operator 6 provides a reflective input.

Figure 13:
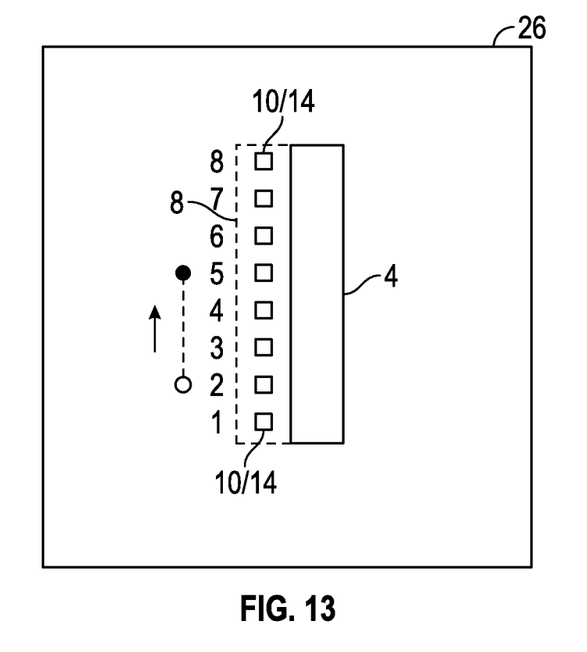

With reference to FIG. 13, an example of how the third embodiment of reflective switch 2 prevents inadvertent actuation is illustrated. In FIG. 13, reflective switch 2 has a linear configuration. In this example, an operator 6 has placed his finger at an initial reflective point having a unique address of two (shown by the open, non-darkened circle). The operator 6 has moved his hand along the touch surface 4, shown by the dashed line, to end reflective point five (shown by the darkened circle). In the third embodiment, the system monitors whether the operator 6 has held her finger or stylus at end reflective point five for a predetermined period of time, e.g., one half second. If the system detects an end reflective point for a predetermined period of time, the tactile feedback motor 24 spins in a given direction, the controller 20 then indexes the new switch state (assuming the addresses were increased to a predetermined threshold), sends a signal to the proper indicia to illuminate, and then communicates the new switch state to the module being controlled by reflective switch 2. Alternatively, a system may include a controller 20 that may sense a change in switch state and send an appropriate signal to an indicia without need for a tactile feedback motor 24.

If the system does not detect a reflective input at the end reflective point for a predetermined period of time, the system loops back to await another operator input. The third embodiment ensures that operator 6 has made an affirmative selection of the desired switch state, thereby preventing inadvertent actuation.

Exemplary Embodiment #4

Figure 14:
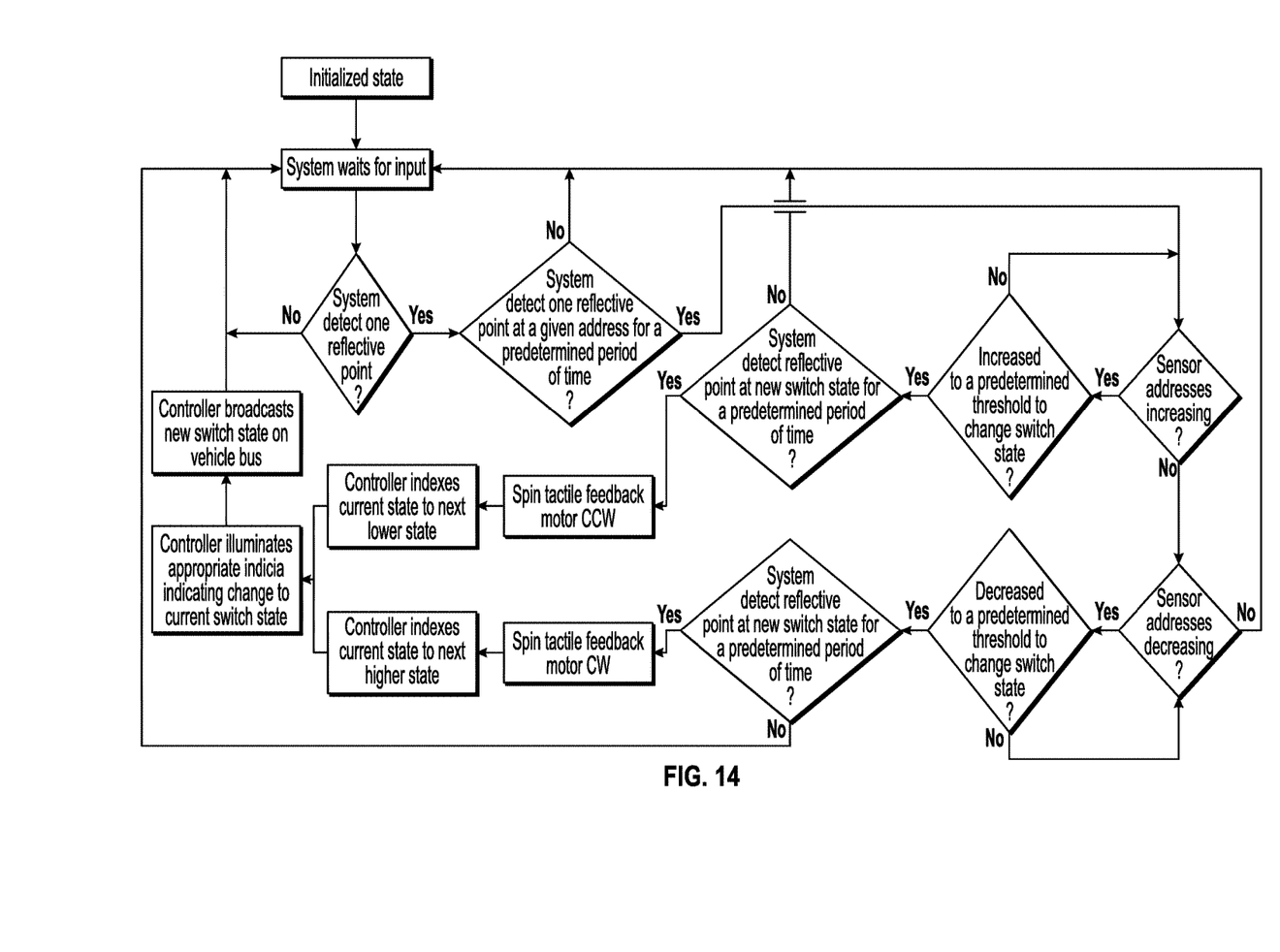
FIG. 14 is a flow chart illustrating how a fourth embodiment of an exemplary reflective switch avoids inadvertent actuation.

A fourth exemplary embodiment of a reflective switch 2 that avoids inadvertent actuation is disclosed in the flow chart of FIG. 14. The fourth embodiment encapsulates the ideas set forth in the second and third embodiments and combines them.

In the fourth embodiment, the system initializes in the same manner as in the first, second, and third embodiments. Next, the system waits for an input from operator 6. Only one input is required by the system in this embodiment. When an input is received at a given unique address (i.e., an initial reflective point), the photo detector 14 that detected the input sends a reflective signal to the controller 20. Once an input is detected, the controller 20 checks to see if the reflective input is held at the initial reflective point for a predetermined period of time.

If the operator 6 holds her finger (or other stylus) at the initial reflective point for a predetermined period of time, the controller 20 will then monitor whether the unique address are increasing or decreasing, and if so, whether the unique addresses have increased or decreased to a predetermined threshold to change the switch state of reflective switch 2. If the operator 6 did not hold his finger at the initial reflective point for a predetermined period of time, the system loops back to await another operator input.

If the unique addresses have increased or decreased to a predetermined threshold to merit a change in switch state, the controller 20 checks to see if the system has detected a reflective input at an end reflective point for a predetermined period of time. If the system detects an end reflective point for a predetermined period of time, tactile feedback motor 24 may be configured to spin in a given direction to alert the operator 6 of a change in switch state, the controller 20 indexes the new switch state, sends a signal to the indicia to illuminate, and then communicates the new switch state to the thing being controlled by reflective switch 2. Alternatively, a system may include a controller 20 that may sense a change in switch state and send an appropriate signal to an indicia without need for a tactile feedback motor 24.

If the system does not detect a reflective input at the end reflective point for a predetermined time, the system loops back to await another operator input. The fourth embodiment seeks to provide a double safe guard for preventing and avoiding inadvertent actuation by forcing the operator 6 to hold his finger at an initial reflective point for a predetermined period of time, and then when the operator 6 has slid his finger to the new desired switch state, the system forces the operator 6 to hold his finger at the end reflective point for a predetermined period of time.

It is to be understood that the above description is intended to be illustrative and not restrictive. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed as new and desired to be protected by Letters Patent of the United States is:

1. A reflective switch, comprising:
   a panel having a translucent zone;
   a touch surface extending perpendicularly from the panel adjacent the translucent zone, whereby fingers of an operator can be quickly located in a correct position to change a switch state of the reflective switch;
   a plurality of photo emitters arranged along and below the translucent zone and oriented to emit light rays along the touch surface;
   a plurality of photo detectors each configured to detect light emitted from the photo emitter and reflected by the fingers of an operator located in proximity to the touch surface, each photo detector having a unique address;
   a controller in communication with each of said plurality of photo detectors, said controller configured to receive a reflective signal generated when one of said plurality of photo detectors detects a reflective input, and
   said controller configured to monitor whether said unique addresses have increased or decreased to a predetermined threshold to change a switch state of said reflective switch.

2. The reflective switch of claim 1, wherein at least two reflective inputs must be detected by at least two of said plurality of photo detectors before said controller monitors whether said unique addresses have increased or decreased to said predetermined threshold to change said switch state of said reflective switch.

3. The reflective switch of claim 1, wherein at least one reflective input must be detected by one of said plurality of photo detectors at an initial reflective point for a predetermined period of time before said controller monitors whether said unique addresses have increased or decreased to said predetermined threshold to change said switch state of said reflective switch.

4. The reflective switch of claim 1, wherein after said controller monitors whether said unique addresses have increased or decreased to said predetermined threshold to change said switch state of said reflective switch, at least one of said plurality of photo detectors must detect at least one reflective input at an end reflective point for a predetermined period of time before said switch state of said reflective switch is changed.

5. The reflective switch of claim 1, wherein at least one of said plurality of photo detectors must detect at least one reflective input at an initial reflective point for a predetermined period of time before said controller monitors whether said unique addresses have increased or decreased to a predetermined threshold to change said switch state of said reflective switch, and after said controller monitors whether said unique addresses have increased or decreased to a predetermined threshold to change said switch state of said reflective switch, at least one of said plurality of photo detectors must detect at least one reflective input at an end reflective point for a predetermined period of time before said switch state of said reflective switch is changed.

6. The reflective switch of claim 1, wherein an indicia indicates a new switch state has been achieved when said unique addresses have increased or decreased to a predetermined threshold to change said switch state of said reflective switch.

7. The reflective switch of claim 1, wherein a tactical feedback motor indicates a new switch state has been achieved when said unique addresses have increased or decreased to a predetermined threshold to change said switch state of said reflective switch.

8. A method for changing the switch state of a reflective switch while avoiding inadvertent actuation of said reflective switch, said method comprising the steps of:
   providing a reflective switch in accordance with claim 1,
   triggering a plurality of the photo emitters to each emit light rays;
   detecting at least one reflective input, a plurality of photo detectors each being configured to detect said reflective input, each of said plurality of photo detectors having a unique address;
   receiving a reflective signal at a controller based upon said reflective input; and
   monitoring whether said unique addresses have increased or decreased to a predetermined threshold to change a switch state of said reflective switch.

9. The method of claim 8, wherein at least two reflective inputs must be detected before monitoring whether said unique addresses have increased or decreased to a predetermined threshold to change said switch state of said reflective switch.

10. The method of claim 8, wherein said at least one reflective input must be detected at an initial reflective point for a predetermined period of time before monitoring whether said unique addresses have increased or decreased to a predetermined threshold to change said switch state of said reflective switch.

11. The method of claim 8, wherein after monitoring whether said unique addresses have increased or decreased to a predetermined threshold to change said switch state of said reflective switch, at least one of said plurality of photo detectors must detect at least one reflective input at an end reflective point for a predetermined period of time before said switch state is changed.

12. The method of claim 8, wherein at least one of said plurality of photo detectors must detect at least one reflective input at an initial reflective point for a predetermined period of time before monitoring whether said unique addresses have increased or decreased to a predetermined threshold to change said switch state of said reflective switch, and after monitoring whether said unique addresses have increased or decreased to a predetermined threshold to change said switch state of said reflective switch, at least one of said plurality of photo detectors must detect at least one reflective input at an end reflective point for a predetermined period of time before said switch state is changed.

13. A reflective switch, comprising:
   a panel having a translucent zone;
   a touch surface extending perpendicularly from the panel adjacent the translucent zone, whereby fingers of an operator can be quickly located in a correct position to change a switch state of the reflective switch;
   a plurality of photo emitters arranged along and below the translucent zone and oriented to emit light rays along the touch surface;
   at least one photo emitter, said photo emitter configured to emit light rays;
   a plurality of photo detectors, each of said plurality of photo detectors configured to detect light emitted from the photo emitter and reflected by the fingers of an operator located in proximity to the touch surface, and each of said plurality of photo detectors having a unique address;
   at least one controller configured to receive at least one reflective signal based upon said reflective input; and
   said controller configured to monitor whether said unique addresses have increased or decreased to a predetermined threshold to change a switch state of said reflective switch.

14. The reflective switch of claim 13, wherein at least two reflective inputs must be detected by at least two of said plurality of photo detectors before said controller monitors whether said unique addresses have increased or decreased to a predetermined threshold to change said switch state of said reflective switch.

15. The reflective switch of claim 13, wherein at least one reflective input must be detected by at least one of said plurality of photo detectors at an initial reflective point for a predetermined period of time before said controller monitors whether said unique addresses have increased or decreased to a predetermined threshold to change said switch state of said reflective switch.

16. The reflective switch of claim 13, wherein after said controller monitors whether said unique addresses have increased or decreased to a predetermined threshold to change said switch state of said reflective switch, at least one of said plurality of photo detectors must detect at least one reflective input at an end reflective point for a predetermined period of time before said switch state is changed.

17. The reflective switch of claim 13, wherein at least one reflective input must be detected by at least one of said plurality of photo detectors at an initial reflective point for a predetermined period of time before said controller monitors whether said unique addresses have increased or decreased to a predetermined threshold to change said switch state of said reflective switch, and after said controller monitors whether said unique addresses have increased or decreased to a predetermined threshold to change said switch state of said reflective switch, at least one of said plurality of photo detectors must detect at least one reflective input at an end reflective point for a predetermined period of time before said switch state is changed.

18. The reflective switch of claim 13, further comprising a panel, a translucent zone, and a touch surface, said touch surface extending axially from said paneling and said translucent zone being disposed about at least a portion of a base of said touch surface, said translucent zone forming a contiguous surface with said paneling.

19. The reflective switch of claim 13, wherein an indicia indicates a new switch state has been achieved when said unique addresses have increased or decreased to a predetermined threshold to change said switch state of said reflective switch.

20. The reflective switch of claim 13, wherein a tactical feedback motor indicates a new switch state has been achieved when said unique addresses have increased or decreased to a predetermined threshold to change said switch state of said reflective switch.

\* \* \* \* \*